US008868363B2

(12) United States Patent
Morrison et al.

(10) Patent No.: US 8,868,363 B2
(45) Date of Patent: Oct. 21, 2014

(54) METHOD OF ESTIMATING PULSE RESPONSE USING AN IMPEDANCE SPECTRUM

(75) Inventors: John L. Morrison, Butte, MT (US); William H. Morrison, Manchester, CT (US); Jon P. Christophersen, Idaho Falls, ID (US); Chester G. Motloch, Idaho Falls, ID (US)

(73) Assignees: Battelle Energy Alliance, LLC, Idaho Falls, ID (US); Qualtech Systems, Inc., East Hartford, CT (US); Montana Tech of the University of Montana, Butte, MT (US)

( * ) Notice: Subject to any disclaimer, the term of this patent is extended or adjusted under 35 U.S.C. 154(b) by 670 days.

(21) Appl. No.: 12/813,750

(22) Filed: Jun. 11, 2010

(65) Prior Publication Data

US 2010/0332165 A1  Dec. 30, 2010

Related U.S. Application Data

(60) Provisional application No. 61/186,358, filed on Jun. 11, 2009.

(51) Int. Cl.
*G01R 31/36* (2006.01)
*H01M 10/0525* (2010.01)

(52) U.S. Cl.
CPC ....... *G01R 31/3662* (2013.01); *H01M 10/0525* (2013.01)
USPC .......................................................... 702/63

(58) Field of Classification Search
CPC .................................................. G01R 31/3662
USPC .............................................. 702/63, 65, 77
See application file for complete search history.

(56) References Cited

U.S. PATENT DOCUMENTS

| 5,061,890 A | 10/1991 | Longini |
| 5,261,007 A | 11/1993 | Hirsch |
| 5,406,496 A | 4/1995 | Quinn |

(Continued)

FOREIGN PATENT DOCUMENTS

JP  2000-009817 A  1/2000

OTHER PUBLICATIONS

Brigham, "The Fast Fourier Transform", 1974, Prentice-Hall, Chapter 4 pp. 50-74, Chapter 13 pp. 198-223.*

(Continued)

*Primary Examiner* — Jonathan C Teixeira Moffat
*Assistant Examiner* — Regis Betsch
(74) *Attorney, Agent, or Firm* — TraskBritt

(57) ABSTRACT

Electrochemical Impedance Spectrum data are used to predict pulse performance of an energy storage device. The impedance spectrum may be obtained in-situ. A simulation waveform includes a pulse wave with a period greater than or equal to the lowest frequency used in the impedance measurement. Fourier series coefficients of the pulse train can be obtained. The number of harmonic constituents in the Fourier series are selected so as to appropriately resolve the response, but the maximum frequency should be less than or equal to the highest frequency used in the impedance measurement. Using a current pulse as an example, the Fourier coefficients of the pulse are multiplied by the impedance spectrum at corresponding frequencies to obtain Fourier coefficients of the voltage response to the desired pulse. The Fourier coefficients of the response are then summed and reassembled to obtain the overall time domain estimate of the voltage using the Fourier series analysis.

20 Claims, 9 Drawing Sheets

(56) References Cited

U.S. PATENT DOCUMENTS

| | | | |
|---|---|---|---|
| 5,454,377 | A | 10/1995 | Dzwonczyk et al. |
| 5,512,832 | A | 4/1996 | Russell et al. |
| 5,946,482 | A | 8/1999 | Barford et al. |
| 6,160,382 | A * | 12/2000 | Yoon et al. ............... 320/136 |
| 6,208,147 | B1 | 3/2001 | Yoon et al. |
| 6,249,186 | B1 | 6/2001 | Ebihara et al. |
| 6,262,563 | B1 * | 7/2001 | Champlin ............... 320/134 |
| 6,307,378 | B1 | 10/2001 | Kozlowski |
| 6,481,289 | B2 | 11/2002 | Dixon et al. |
| 6,653,817 | B2 | 11/2003 | Tate, Jr. et al. |
| 6,832,171 | B2 | 12/2004 | Barsoukov et al. |
| 7,065,474 | B2 | 6/2006 | Petchenev et al. |
| 7,395,163 | B1 * | 7/2008 | Morrison et al. ............ 702/75 |
| 7,616,003 | B2 | 11/2009 | Satoh et al. |
| 7,675,293 | B2 | 3/2010 | Christophersen et al. |
| 2002/0065621 | A1 | 5/2002 | Jungerman |
| 2003/0206021 | A1 | 11/2003 | Laletin et al. |
| 2005/0127908 | A1 | 6/2005 | Schlicker et al. |
| 2005/0182584 | A1 | 8/2005 | Plusquellic |
| 2007/0257681 | A1 * | 11/2007 | Christophersen et al. .... 324/426 |
| 2008/0303528 | A1 | 12/2008 | Kim |
| 2009/0076752 | A1 | 3/2009 | Wang et al. |
| 2010/0010762 | A1 | 1/2010 | Seki |
| 2010/0274510 | A1 | 10/2010 | Morrison et al. |

OTHER PUBLICATIONS

Brigham, "The Fast Fourier Transform", 1974, Prentice-Hall, Chapter 6 pp. 94-98.*

Brigham, "The Fast Fourier Transform", 1974, Prentice-Hall, Chapter 1 pp. 1-10.*

Brigham, "The Fast Fourier Transform", 1974, Prentice-Hall, Chapter 7 pp. 110-122.*

Albreht, Weston, "Battery Complex Impedance Identification with Random Signal Techniques," May 4, 2005, Montana Tech of the University of Montana, 99 pages.

Alpaydin, Ethem, "Radial Basis Functions," 2004, Chapter 12.3, pp. 284-290, Introduction to Machine Learning, The MIT Press, Cambridge, Massachusetts, London, England.

Chapra, "Numerical Methods for Engineers," pp. 394-398, McGraw-Hill Publishing Company, 1985.

Christophersen, Jon P., "Impedance Noise Identification for State-of-Health Prognostics," Jul. 7-10, 2008, Philadelphia, PA, 43rd Power Sources Conference, 4 pages.

Fenton et al., "BSM Development Documentation Senior Project Final Report for the Idaho National Laboratory," May 2005, Montana Tech of the University of Montana, 21 pages.

"FreedomCAR Battery Test Manual for Power-Assist Hybrid Electric Vehicles," manual, Oct. 2003, Appendix D, DOE/ID-11069, Idaho National Laboratory, 130 pages.

Mix, Dwight F., "Random Signal Processing," p. 296, Prentice Hall Publishing Company, 1995.

Morrison et al., "Real Time Estimation of Battery Impedance," Proceedings from the IEEE Aerospace Conference, Mar. 5-11, 2006, Big Sky, MT, 13 pages.

Morrison, William H., "Intelligent Self-Evolving Prognostic Fusion, Phase I STTR Interim Report," Jul. 29, 2005, Qualtech Systems, Inc., NASA, Ames Research Center, 23 pages.

Nikolopoulos et al., "Accurate Method of Representation of High-Voltage Measuring Systems and its Application in High-Impulse-Voltage Measurements," Mar. 1989, IEEE, vol. 136, Issue 2, pp. 66-72, Science, Measurement and Technology, IEEE Proceedings A, Dept. of Electr. Eng., Nat. Tech. Univ., Athens, Greece.

Smith et al., "Model Validation Approaches for Nonlinear Feedback Systems Using Frequency Response Measurements," Dec. 7-10, 1999, 1500-1504, vol. 2, IEEE, Proceedings of the 38th IEEE Conference on Decision and Control, Phoenix, AZ.

Smyth, Brian, "Development of a Real Time Battery Impedance Measuring System," M.S. Thesis Montana Tech of the University of Montana, 2008, 128 pages.

U.S. Appl. No. 12/217,013, filed Jun. 30, 2008 to Morrison et al., titled, "Method of Detecting System Function by Measuring Frequency Response."

U.S. Appl. No. 13/100,184, filed May 3, 2011 to Christophersen et al., titled, "Crosstalk Compensation in Analysis of Energy Storage Devices."

U.S. Appl. No. 13/100,170, filed May 3, 2011 to Christophersen et al., titled, "In-Situ Real-Time Energy Storage Device Impedance Identification."

Wasserman, Philip D., "Radial Basis-Function Networks," Chapter 8, pp. 147-176, Advanced Methods in Neural Computing, 1993, New York: Van Nostrand Reinhold.

Ziemer et al., "Signals and Linear Systems," 2002, Chapter 2, pp. 56-123, Principles of Communications, 5th edition, John Wiley & Sons.

PCT International Search Report and Written Opinion of the International Searching Authority for PCT/US2010/038401, dated Dec. 31, 2010, 8 pages.

PCT International Search Report and Written Opinion of the International Searching Authority for PCT/US2010/038358, dated Dec. 31, 2010, 8 pages.

PCT International Search Report and Written Opinion of the International Searching Authority for PCT/US11/35052, dated Jul. 26, 2011, 11 pages.

Ramos et al., Comparison of impedance measurements in a DSP using ellipse-fit and seven-parameter sine-fit algorithms, Measurement 42 (May 23, 2009) pp. 1370-1379. Retrieved online at <http://www.sciencedirect.com/science/article/pii/S0263224109001031>.

Ranade et al., An overview of harmonics modeling and simulation, Elect. Power Syst. Res., vol. 74, pp. 37-56, Apr. 2005, Retrieved online at <http://www.calvin.edu/~pribeiro/IEEE/ieee_cd/chapters/pdffiles/c1pdf.pdf>.

Christophersen, J.P., et al., Effects of Reference Performance Testing during Aging Using Commercial Lithium-ion Cells, J. Electrochem Soc., 2006, pp. A2406-A1416, 153.

Morrison, J.L., et al, Fast Summation Transformation for Battery Impedance Identification, IEEE Aerospace 2009 Conference, Mar. 7-14, 2009, Big Sky, Montana.

Christophersen, J.P., et al., Lumped Parameter Modeling as a Predictive Tool for a Battery Status Monitor, Oct. 2003, Proceedings from IEEE Vehicular Technology Conference.

Christophersen, J.P., et al., Electrochemical Impedance Spectroscopy Testing on the Advanced Technology Development Program Lithium-ion Cells, 2002, IEEE Trans. Veh. Technol., pp. 1851-1855, 56(3).

* cited by examiner

METHOD OF ESTIMATING PULSE RESPONSE USING AN IMPEDANCE SPECTRUM

CROSS-REFERENCE TO RELATED APPLICATION

This application claims the benefit of U.S. Provisional Patent Application No. 61/186,358, filed Jun. 11, 2009. The disclosure of this application is hereby incorporated by reference in its entirety, including all figures, tables and drawings.

STATEMENT REGARDING FEDERALLY SPONSORED RESEARCH OR DEVELOPMENT

This invention was made with government support under Contract No. DE-AC07-05ID14517 awarded by the United States Department of Energy. The government has certain rights in the invention.

TECHNICAL FIELD

Embodiments of the present disclosure relate generally to determining parameters of energy storage devices and, more specifically, to determining impedance and output characteristics of energy storage devices.

BACKGROUND OF THE INVENTION

Energy storage devices (e.g., batteries, fuel cells, ultracapacitors, etc.) have become significantly more prevalent in many government and commercial applications (e.g., automotive, military, space, electric utilities, medical, etc.). Consequently, there has also been an increased interest in smart monitoring systems that can effectively manage energy storage devices (ESDs) so as to optimize performance and extend life. An important aspect of these smart monitoring systems is the ability to estimate the response of an ESD to an anticipated load.

For example, the Lumped Parameter Model (LPM) has been used extensively by the Idaho National Laboratory (INL) to estimate the voltage response of a battery to a constant-current pulse for automotive applications. The LPM is an equivalent circuit model that recursively solves for the voltage behavior based on a given excitation current and a set of difference equations. It has been shown that the LPM is sensitive to variations in pulse amplitude and duration and could, therefore, be a useful measure of state-of-health (Christophersen et al., "Lumped Parameter Modeling as a Predictive Tool for a Battery Status Monitor," Proceedings from 2003 IEEE Vehicular Technology Conference, October 2003), the content of which is hereby incorporated by reference in its entirety.

However, the excitation signals required to obtain estimates of the ESD response are not well suited for in-situ applications since it generally requires a pulse test, which may cause larger state-of-charge (SOC) swings than desired and even adversely affect the ESD (Christophersen et al., "Effects of Reference Performance Testing During Aging Using Commercial Lithium-Ion Cells," *J. Electrochem. Soc.,* 153, A1406-A1416, 2006), the content of which is hereby incorporated by reference in its entirety. A need still exists to estimate the response of an ESD to an anticipated load using benign measurement techniques.

The INL has also shown that the pulse resistance for batteries is strongly correlated with the growth observed from corresponding electrochemical impedance spectroscopy (EIS) measurements (Christophersen et al., "Electrochemical Impedance Spectroscopy Testing on the Advanced Technology Development Program Lithium-Ion Cells," *IEEE Trans. Veh. Technol.,* 56 (3), 1851-1855, 2002), the content of which is hereby incorporated by reference in its entirety. It has also been shown that EIS techniques are more benign than pulse tests (Christophersen et al., "Effects of Reference Performance Testing During Aging Using Commercial Lithium-Ion Cells," *J. Electrochem. Soc.,* 153, A1406-A1416, 2006) since it is a low-level, charge neutral signal that minimally perturbs the ESD. Suitable means for obtaining in-situ impedance spectra have already been developed. The Impedance Noise Identification method (U.S. Pat. No. 7,675,293), the content of which is hereby incorporated by reference in its entirety) uses a random signal excitation to acquire a high-resolution impedance spectrum, but at the expense of computationally intensive data processing. An alternative approach is known as "Compensated Synchronous Detection" (U.S. Pat. No. 7,395,163), the content of which is hereby incorporated by reference in its entirety), and it incorporates a wideband sum-of-sines (SOS) input signal to measure the impedance. It yields a faster measurement, but at the expense of lower resolution. A variant of Compensated Synchronous Detection is Fast Summation Transformation (FST). The principal attributes of FST (Morrison et al., "Fast Summation Transformation for Battery Impedance Identification," *IEEE Aerospace* 2009 *Conference,* March 7-14, Big Sky, Mont., the content of which is hereby incorporated by reference in its entirety) are that it only requires one period of the lowest frequency to complete the measurement, and the data processing algorithm is very simple.

BRIEF SUMMARY OF THE INVENTION

The subject invention involves a method by which the response of an energy storage device (ESD) to a pulse excitation can be predicted using impedance measurement techniques. This method assumes that the amplitude and duration of the anticipated or desired pulse excitation is known a priori, or can be inferred based on historical data (e.g., an average pulse profile based on typical automotive driving cycles). Assuming a periodic behavior of the desired pulse profile, the Fourier series coefficients can then be determined (note that the assumption of a periodic signal is for analytical purposes), and combined with measured impedance data to estimate the response.

The Fourier Series coefficients of the desired pulse profile are first used to establish the frequency range of the impedance measurement. For example, the period of the lowest frequency for the impedance measurement should be less than or equal to the period of the desired pulse profile. The maximum frequency of the impedance measurement should be greater than or equal to the largest desired harmonic value used in the Fourier coefficients used to recreate the desired pulse profile.

Knowing the desired frequency range, the ESD impedance spectrum can then be measured using any available methodology. For rapid, in-situ applications, techniques such as Impedance Noise Identification, Compensated Synchronous Detection, or Fast Summation Transformation can be easily implemented. The frequencies in the impedance measurement spectrum should correspond to the Fourier coefficients from the simulated pulse. In some cases (i.e., with Fast Summation Transformation), the impedance spectra will be lower resolution than desired due to the need for a very rapid measurement. However, the use of linear interpolation, cubic spline functions, or other similar types of curve-fitting techniques can be used to estimate the impedance at other desired frequencies within the measured range.

Using a constant-current pulse as an example, the Fourier coefficients of the desired or anticipated pulse profile are multiplied by the corresponding impedance measurements at each frequency. These data will provide the voltage response at each frequency of interest, and the results can then be summed to determine the overall voltage response of the ESD to the anticipated current pulse profile.

Thus, the ESD response of a pulse excitation can be estimated based on a simple impedance measurement combined with the Fourier coefficients of a simulated pulse. The estimated response behavior can be used by smart monitoring systems to more effectively manage ESD usage. For example, if the estimated response exceeds a desired threshold, the smart monitoring system can either shut down operations, or iteratively determine a pulse excitation level that can be successfully applied to the ESD without violating operational limits (i.e., managing how much power assist is provided by the ESD in automotive applications). A smart system can also use this information to know when warning signals should be sent to a user prior to a demand being placed on the ESD.

DETAILED DESCRIPTION OF THE INVENTION

The method of the subject invention uses wideband impedance measurements to predict the response of an energy storage device (ESD) to a pulse excitation. The impedance spectra can be acquired by various methods, but rapid, in-situ techniques such as Fast Summation Transformation (FST) are preferred. FST is based on a computationally simple approach, and it only requires one period of the lowest frequency to complete a measurement (Morrison et al., "Fast Summation Transformation for Battery Impedance Identification," *IEEE Aerospace* 2009 *Conference*, March 7-14, Big Sky, Mont.).

Figure 1:
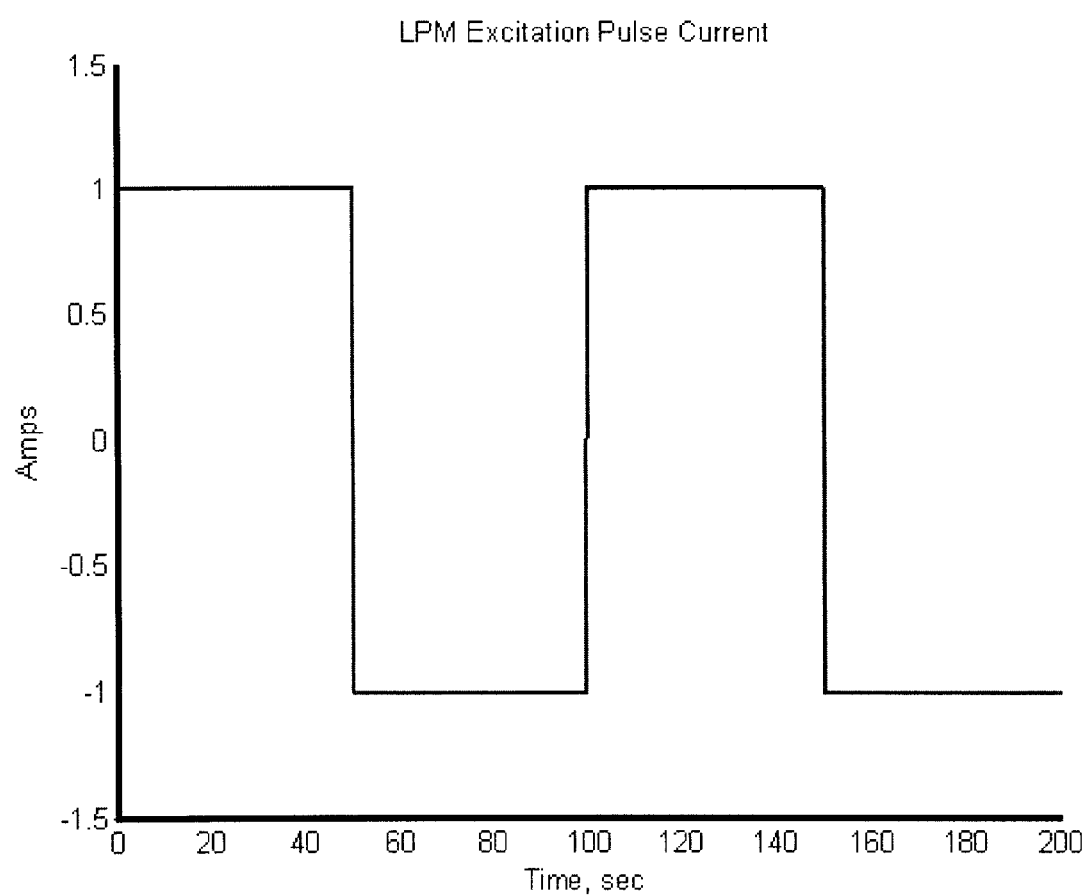
FIG. 1 is an example excitation pulse profile with a constant-current input.
Figure 2:
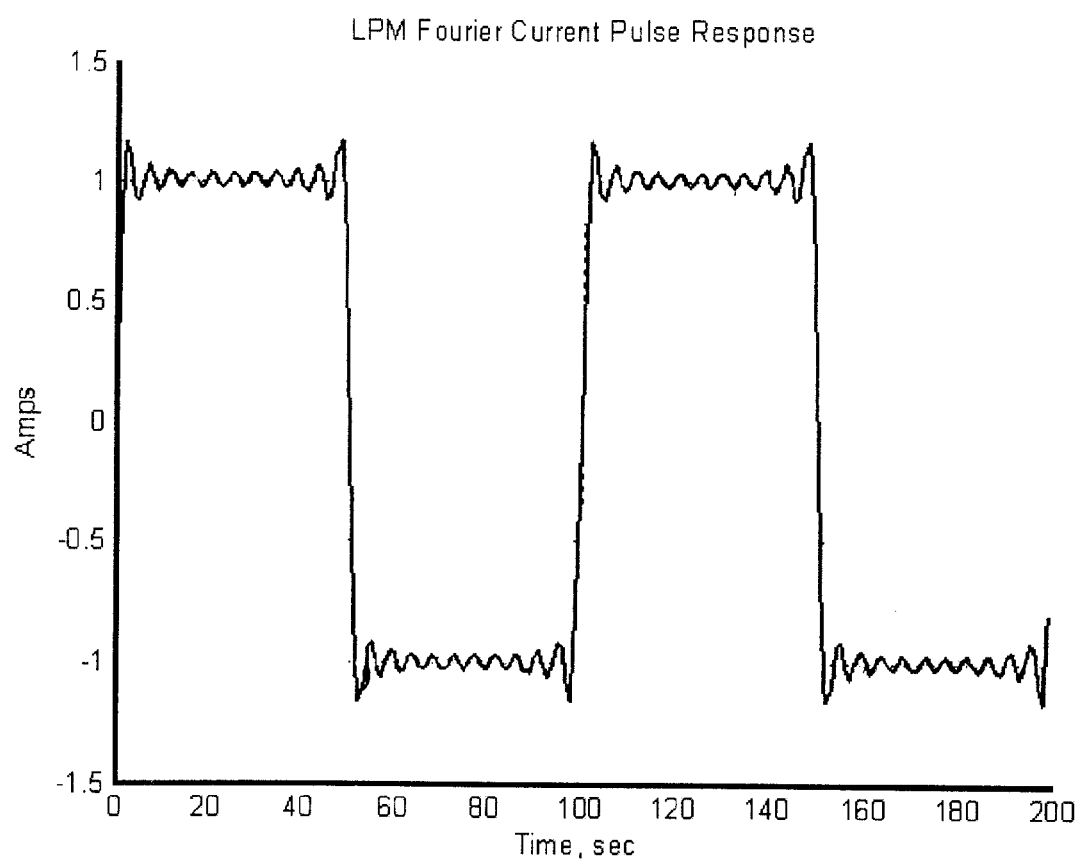
FIG. 2 depicts a reproduction of an example excitation pulse profile using 21 Fourier Series coefficients.

In a preferred embodiment, the anticipated or desired excitation pulse consists of a constant-current square wave profile. If it assumed that this profile is periodic (for analysis purposes only), the waveform can be decomposed into the constituent harmonic components using Fourier series methods. An example of an excitation pulse is shown in FIG. 1 and described by Equation 1, where a constant-current pulse (i.e., $I_P$) is applied for a discharge (i.e., $+I_P$) and charge (i.e., $-I_P$) step over two periods with $T_0$ set to one-half the period T. Given the exponential Fourier series pair shown in Equation 2, the coefficient $C_n$ for the given square wave is provided by Equation 3. The Fourier series harmonic frequency is provided in Equation 4. Based on these equations, the reassembled square wave of FIG. 1 using 21 harmonics is depicted in FIG. 2. As shown, using 21 harmonics is sufficient to capture the shape of the square-wave pulse with only a small ripple at the desired ±1 A current level. As expected, the Gibbs effect is also evident as well.

$$\left\{ \begin{array}{ll} f(t) = I_P, & 0 < t < T_0 \\ f(t) = -I_P, & T_0 < t, T \end{array} \right\} \quad (1)$$

Where:
T is the period
$T_0$ is the pulse width
$I_P$ is the current pulse amplitude $$f(t) = \sum_{n=-\infty}^{\infty} (C_n e^{jn\omega_O t}), \quad \omega_O = \frac{2\pi}{T}, \quad C_n = \frac{1}{T} \int_T f(t) e^{-jn\omega_O t} dt \quad (2)$$

$$C_n = I_P \text{sinc}\left(\frac{n\pi}{2}\right) e^{-j\frac{n\pi}{2}}, \quad n = \pm 1, \pm 3, \pm 5 \ldots \quad (3)$$

$$\omega_n = n\omega_o = \frac{n2\pi}{T} \quad (4)$$

The frequency range of the impedance measurement should be well matched with the Fourier series harmonic frequencies (Equation 4). For example, the lowest frequency for the impedance measurement should be less than or equal to the period of the simulated pulse (i.e., less than or equal to 1/T). The highest frequency for the impedance measurement should correspond to the maximum harmonic component desired to recreate the pulse waveform (i.e., the maximum value for n used to recreate f(t) in Equation 2).

If the measured frequencies in the impedance spectrum match the desired Fourier harmonic frequency components from the simulated pulse waveform, then the responses from the ESD to an excitation pulse can be obtained at each frequency. For example, the impedance of the ESD at a given frequency (i.e., $\omega_n = n\omega_o$), is shown in Equation 5. The voltage response at that frequency is the impedance (Equation 5) multiplied by the corresponding harmonic component of the current pulse (Equation 3), as shown in Equation 6. Based on the Fourier series pair of Equation 2, the estimated voltage drop due to a current pulse is the sum of the individual frequencies, as shown in Equation 7. Given a bias voltage ($V_{BO}$), the ESD voltage response ($V_P$) can then be estimated as shown in Equation 8, where the voltage drop ($V_Z$) is subtracted from the bias. Thus, if the terminal voltage of the ESD is known or measured, and if a relatively recent impedance spectrum of the ESD is available, then an estimate of the response to an excitation pulse can be obtained.

$$\vec{Z}_B(\omega_n) = Z_B(\omega_n) \sphericalangle \phi_{\omega_n} \quad (5)$$

$$\vec{V}_Z(t) = I_P \text{sinc}\left(\frac{n\pi}{2}\right) |Z_B(n\omega_0)| \cos\left(n\omega_0 t - \frac{n\pi}{2} + \phi_{n\omega_0}\right) \quad (6)$$

$$V_Z(t) = \sum_{\langle n=1,3,5,\ldots\rangle} I_P \text{sinc}\left(\frac{n\pi}{2}\right) |Z_B(n\omega_0)| \cos\left(n\omega_0 t - \frac{n\pi}{2} + \phi_{Z(n\omega_0)}\right) \quad (7)$$

$$V_P(t) = V_{B0} - V_Z(t) \quad (8)$$

To make use of Equation 8, the values of the impedance spectrum $\vec{Z}_B$ at the Fourier series frequencies $\omega_n$ must be obtained. In most cases, however, the impedance measurements will have a logarithmic frequency spread, whereas the Fourier series uses linearly increasing frequency components. This can be resolved by using linearly increasing frequencies during the impedance measurement instead, but at the expense of longer measurement durations and more computationally intensive analysis techniques. Another option is to estimate the impedance at the desired frequencies within the measurement range using techniques such as linear interpolation or cubic spline fits to obtain the values of the impedance spectrum $\vec{Z}_B$ at the Fourier series frequencies $\omega_n$.

Analytical Validation

Figure 3:
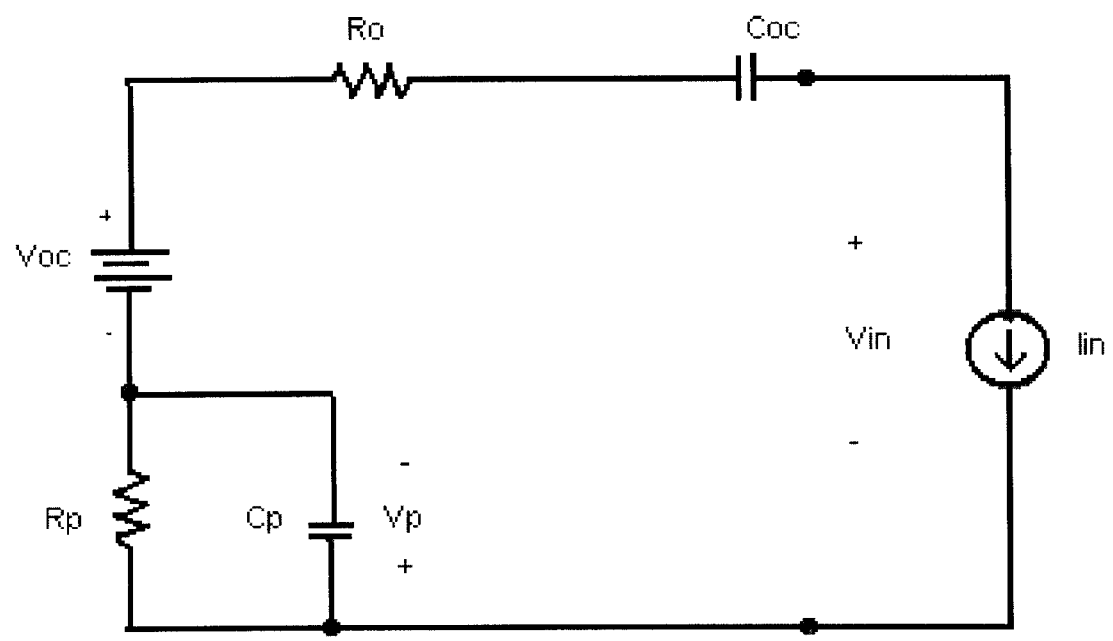
FIG. 3 is a diagram of an LPM equivalent circuit with a current source excitation.
Figure 4:
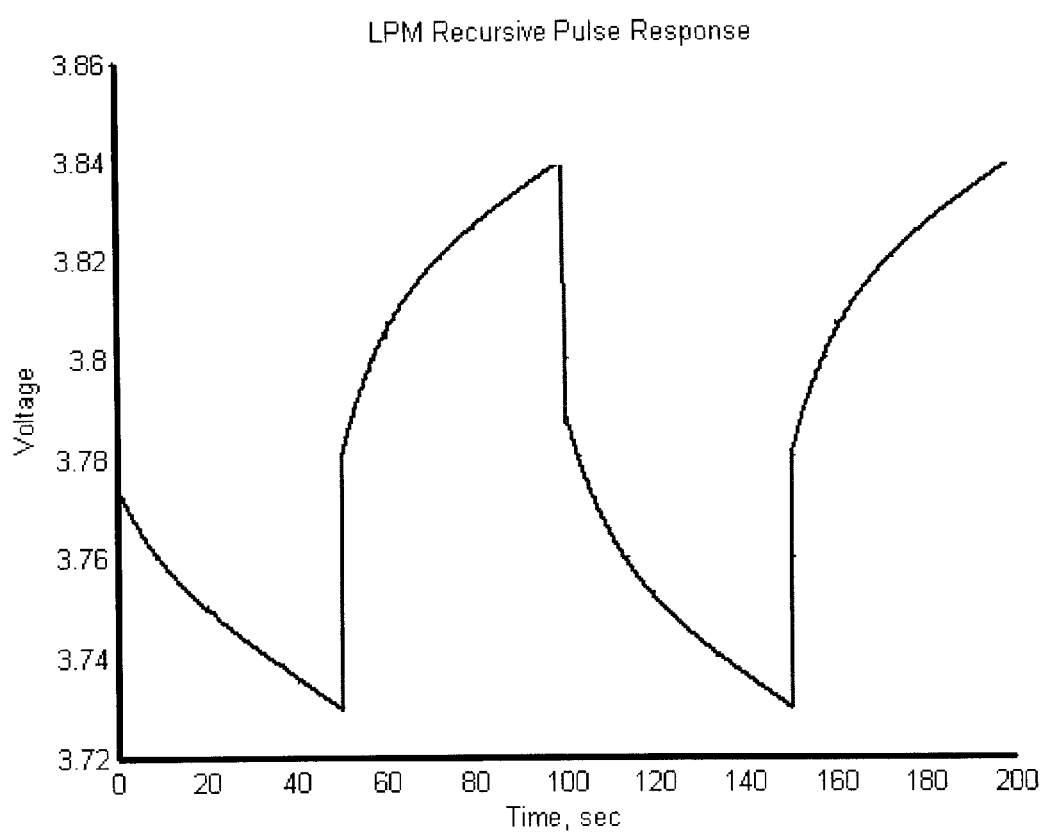
FIG. 4 is a plot of an ideal voltage response of an LPM to a pulse excitation.

The Lumped Parameter Model (LPM) was used to verify the effectiveness of this method. The LPM equivalent circuit is shown in FIG. 3, and example component values for a lithium-ion battery are shown in Table 1 (Morrison et al., "Fast Summation Transformation for Battery Impedance Identification," *IEEE Aerospace* 2009 *Conference*, March 7-14, Big Sky, Mont.). The ideal voltage response of the LPM to the pulse excitation of FIG. 1 is shown in FIG. 4. As expected, there is an initial jump due to an ohmic effect, followed by a polarization effect for the remainder of the pulse duration.

TABLE 1

Representative LPM and Analysis Data

| | |
|---|---|
| Voc = | 3.8 V |
| Cp = | 666.6667 F. |
| Coc = | 1.6667e+003 F. |
| Ro = | .0250 Ω |
| Rp = | .015 Ω |

Figure 5A:
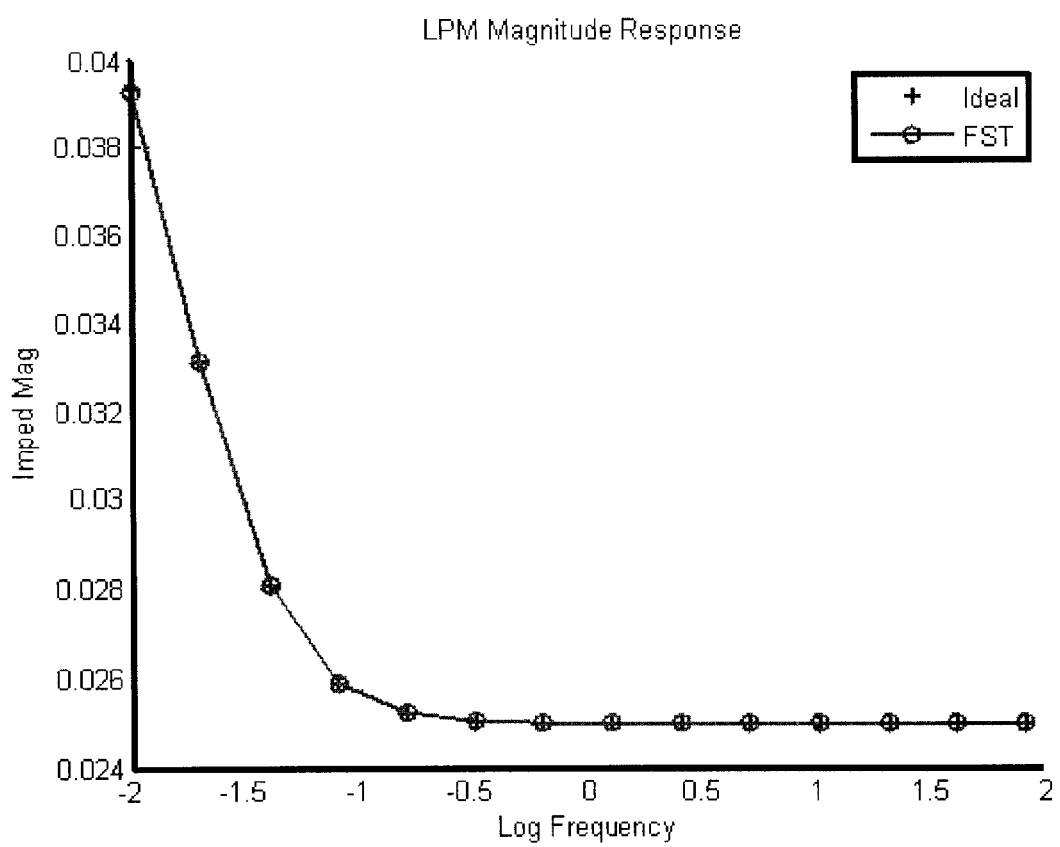
FIG. 5a is a plot of an impedance spectrum magnitude for both ideal and simulated conditions.
Figure 5B:
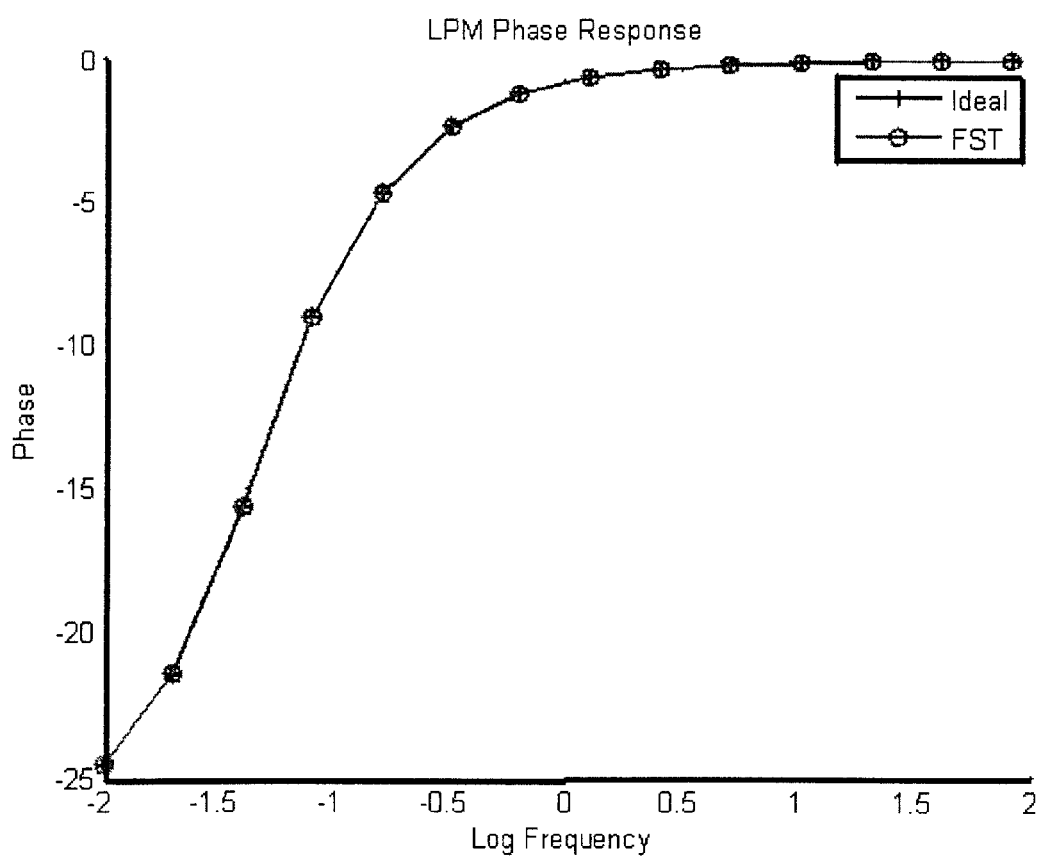
FIG. 5b is a plot of an impedance spectrum phase for both ideal and simulated conditions.

The impedance spectrum of the LPM can be simulated using the Fast Summation Transformation measurement technique (Morrison et al., "Fast Summation Transformation for Battery Impedance Identification," *IEEE Aerospace* 2009 *Conference*, March 7-14, Big Sky, Mont.) and compared to the ideal response of the equivalent circuit. The FST algorithm was applied to the LPM at the same starting frequency as the square wave pulse profile of FIG. 1 (i.e., 0.01 Hz). FIGS. 5a and 5b show that the FST analysis matches very well in both magnitude and phase, respectively, with the expected LPM response over fourteen octave steps for a broad frequency range.

However, as described above, the resolution of FST is insufficient to estimate the pulse response. To obtain a higher resolution impedance spectrum, the cubic spline fit was implemented using built-in software functions (e.g., in MATLAB® matrix calculation computer software) and the resulting impedance estimations were compared to the expected response. The expected impedance can be calculated based on the frequency response of the LPM using the assumed parameters shown in Table 1. Table 2 shows the expected and estimated impedance for ten sequential odd-numbered harmonic frequencies, with a starting frequency of 0.01 Hz. As shown, the spline fit is very good compared to the expected impedance spectrum.

TABLE 2

Cubic Spline Fit of FST Impedance Data Compared to Ideal LPM Response

| Freq | Spline LPM Spectrum | Expected LPM Spectrum |
|---|---|---|
| .01 | 0.0358-0.0163i | 0.0358-0.0163i |
| .03 | 0.0283-0.0093i | 0.0283-0.0094i |
| .05 | 0.0264-0.0062i | 0.0264-0.0062i |
| .07 | 0.0257-0.0046i | 0.0257-0.0046i |
| .09 | 0.0255-0.0036i | 0.0255-0.0036i |
| .11 | 0.0253-0.0030i | 0.0253-0.0030i |
| .13 | 0.0252-0.0025i | 0.0252-0.0025i |
| .15 | 0.0252-0.0022i | 0.0252-0.0022i |
| .17 | 0.0251-0.0020i | 0.0251-0.0020i |
| .19 | 0.0251-0.0018i | 0.0251-0.0018i |

Figure 6:
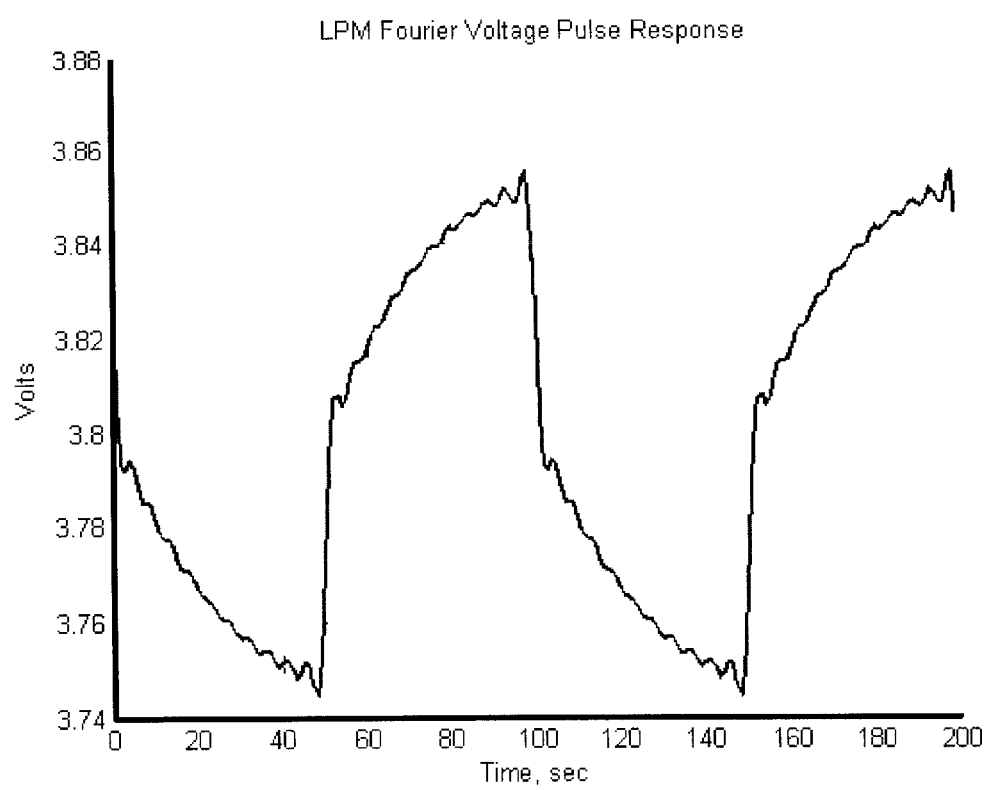
FIG. 6 is a graph of an estimated voltage response of an excitation pulse based on a wideband impedance measurement.
Figure 7:
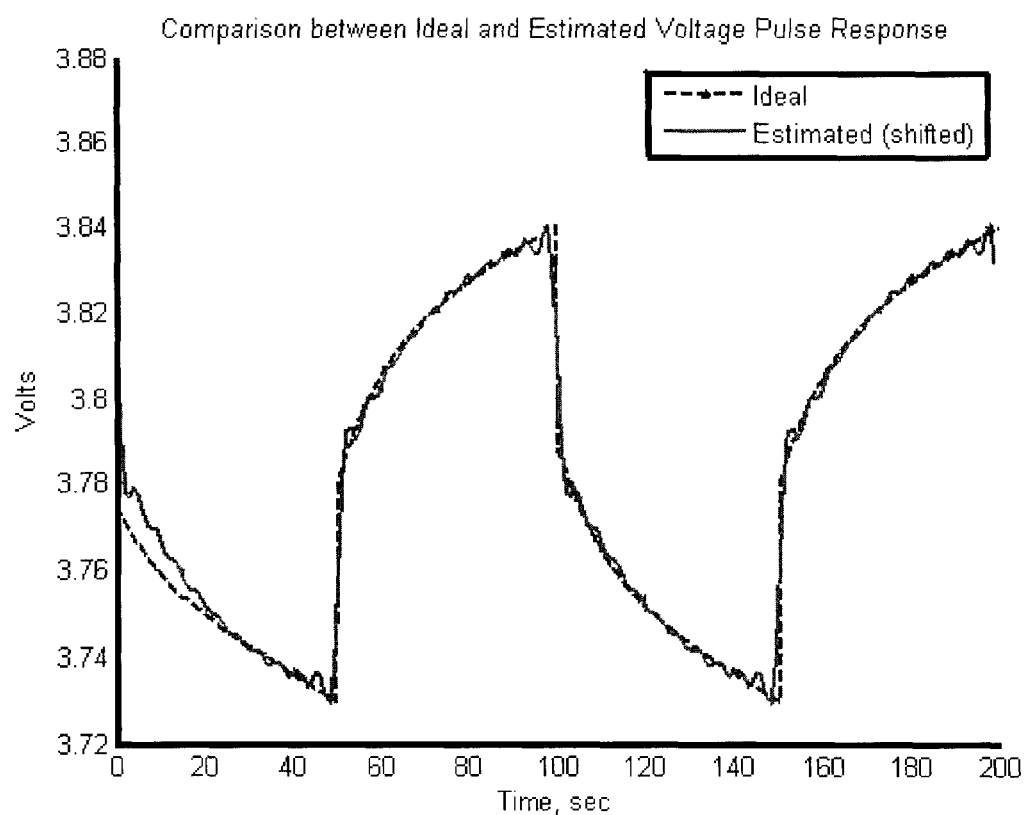
FIG. 7 is a comparison between an ideal and an estimated voltage response of an excitation pulse.

Equations 6 through 8 were then implemented to estimate a voltage response of the desired pulse based on the known input current and the FST impedance measurements. The resulting voltages at each frequency were summed, and the total response is shown in FIG. 6. Compared to the ideal response (FIG. 4), the overall shape of the estimated response is similar, but there is still a small ripple due to the Fourier Series Gibbs effect. Also, the estimated response profile shows a small voltage offset (~15 mV) compared to the ideal. FIG. 7 shows the estimated response (scaled by 15 mV) overlaid onto the ideal response. The estimated change in voltage is very closely matched with the ideal response for each pulse in the profile. The initial estimated behavior (i.e., for the first 20 seconds) is slightly different since the ideal response through the LPM assumed the initial conditions were at rest, whereas the Fourier Series analysis necessarily assumes a steady-state operation (i.e., infinite periodic behavior).

Figure 8:
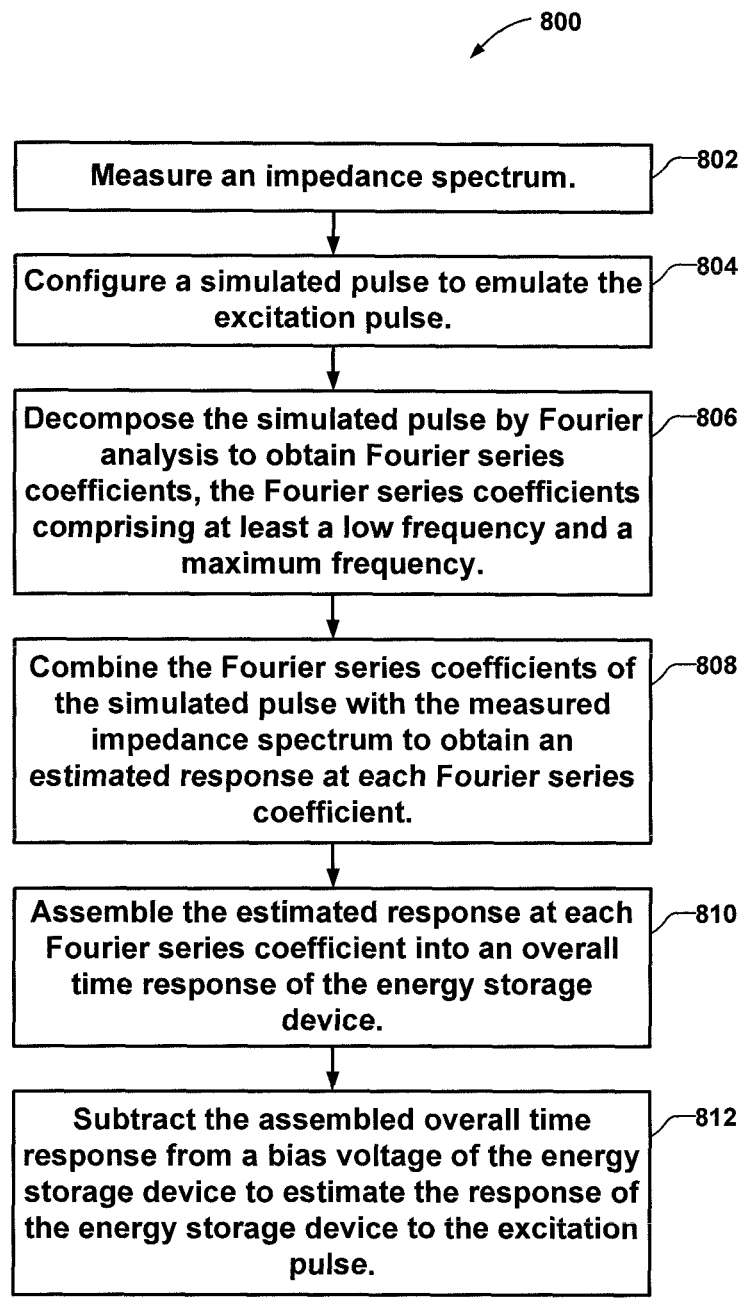
FIG. 8 is flow chart showing a method of using an impedance spectrum of an energy storage device to estimate a pulse response of the energy storage device.

FIG. 8 is flow chart showing a method 800 of using an impedance spectrum of an energy storage device to estimate a pulse response of the energy storage device. These acts may be accomplished with a system including a computing system and a data acquisition device, such as, for example, a system shown in FIG. 3 of U.S. Pat. No. 7,675,293 which was incorporated by reference earlier in this description. The method 800 may be used to assess a condition of an energy storage device by estimating a response to an excitation pulse. Operation block 802 indicates that an impedance spectrum is measured. The impedance spectrum includes a response of the energy storage device to a stimulus including a frequency range including at least a lowest frequency and at least a highest frequency, as previously described.

Operation block 804 indicates that a simulated pulse is configured to emulate the excitation pulse. Operation block 806 indicates that the simulated pulse may be decomposed by Fourier analysis to obtain Fourier series coefficients, the Fourier series coefficients comprising at least a low frequency and a maximum frequency. Operation block 808 indicates that the Fourier series coefficients of the simulated pulse may be combined with the measured impedance spectrum to obtain an estimated response at each Fourier series coefficient.

Operation block 810 indicates that the estimated response may be assembled at each Fourier series coefficient into an overall time response of the energy storage device. Operation block 812 indicates that the assembled overall time response may be subtracted from a bias voltage of the energy storage device to estimate the response of the energy storage device to the excitation pulse.

It is understood that the foregoing examples are merely illustrative of the present invention. Certain modifications of the articles and/or methods may be made and still achieve the objectives of the invention. Such modifications are contemplated as within the scope of the claimed invention.

REFERENCES

J. P. Christophersen, C. D. Ho, C. G. Motloch, D. Howell, and H. Hess, "Effects of Reference Performance Testing During Aging Using Commercial Lithium-Ion Cells," *J. Electrochem. Soc.,* 153, A1406-A1416 (2006).

John L. Morrison, et al., 2009 "Fast Summation Transformation for Battery Impedance Identification," IEEE Aerospace 2009 Conference, March 7-14, Big Sky, Mont., (2009).

J. P. Christophersen, C. G. Motloch, C. D. Ho, J. L. Morrison, R. C. Fenton, V. S. Battaglia, and T. Q. Duong, "Lumped Parameter Modeling as a Predictive Tool for a Battery Status Monitor," Proceedings from 2003 IEEE Vehicular Technology Conference, October (2003).

J. P. Christophersen, D. F. Glenn, C. G. Motloch, R. B. Wright, C. D. Ho, and V. S. Battaglia, "Electrochemical Impedance Spectroscopy Testing on the Advanced Technology Development Program Lithium-Ion Cells," *IEEE Trans. Veh. Technol.,* 56 (3), 1851-1855 (2002).

The invention claimed is:

1. A method of assessing a condition of an energy storage device by estimating a response to an excitation pulse, the method comprising the acts of:
    defining a simulated pulse profile comprising a periodic train of pulses to emulate the excitation pulse;
    decomposing the simulated pulse profile by Fourier analysis to obtain Fourier series coefficients at Fourier series frequencies, the Fourier series frequencies comprising a low frequency at the frequency of the periodic train of pulses, a largest selected harmonic frequency and harmonic frequencies therebetween;
    measuring an impedance spectrum comprising measured responses of the energy storage device to a stimulus at a plurality of frequencies, wherein one or more frequencies of the plurality of frequencies is different from the Fourier series frequencies;
    estimating values for the impedance spectrum at one or more of the Fourier series frequencies when the impedance spectrum does not include a value at the one or more of the Fourier series frequencies;
    for each of the Fourier series frequencies, combining the Fourier series coefficients with either a measured value or an estimated value of the impedance spectrum at a corresponding frequency to obtain an estimated response at that corresponding frequency;
    assembling the estimated responses for each of the Fourier series frequencies into an overall time response of the energy storage device; and
    subtracting the overall time response from a bias voltage of the energy storage device to estimate the response of the energy storage device to the excitation pulse.

2. The method of claim 1, wherein the impedance spectrum is obtained offline over a broad frequency range between a frequency that is less than or equal to the low frequency and a frequency that is greater than or equal to the largest selected harmonic frequency of the low frequency.

3. The method of claim 1, wherein the impedance spectrum is obtained offline over a broad frequency range between a frequency that is less than or equal to the low frequency and a frequency that is greater than or equal to the largest selected harmonic frequency of the low frequency and the impedance spectrum is selected from the group consisting of a logarithmic frequency range, and a linearly spread frequency range.

4. The method of claim 1, wherein the impedance spectrum is obtained online over a broad frequency range between a frequency that is less than or equal to the low frequency and a frequency that is greater than or equal to the largest selected harmonic frequency of the low frequency using techniques selected from the group consisting of Impedance Noise Identification, Compensated Synchronous Detection, and Fast Summation Transformation.

5. The method of claim 4, wherein the impedance spectrum is obtained in-situ.

6. The method of claim 1, wherein the simulated pulse profile is selected from the group consisting of a square wave, a triangle and a sawtooth wave.

7. The method of claim 1, wherein the simulated pulse profile is configured from a constant current, a constant voltage, or a constant power.

8. The method of claim 1, wherein the low frequency used in the Fourier series is greater than or equal to a lowest frequency of the impedance spectrum and wherein the largest selected harmonic frequency used in the Fourier series is less than or equal to a highest frequency of the impedance spectrum.

9. The method of claim 1, further comprising estimating values for the measured impedance spectrum at frequencies corresponding to the Fourier series coefficients through methods selected from the group consisting of linear interpolation and cubic spline fit.

10. The method of claim 1, further comprising smoothing the estimated response through signal processing techniques to minimize or mitigate a Gibbs effect.

11. A system for assessing a condition of an energy storage device by estimating a response to an excitation pulse, the system comprising:
    a data acquisition device configured to:
        provide a stimulus to the energy storage device, the stimulus including a frequency range including at least a lowest frequency and at least a highest frequency; and
        obtain an impedance spectrum, the impedance spectrum comprising a response of the energy storage device to the stimulus; and
    a computing system configured to:
        define a simulated pulse profile comprising a periodic train of pulses to emulate the excitation pulse;
        decompose the simulated pulse profile by Fourier analysis to obtain Fourier series coefficients at Fourier series frequencies, the Fourier series frequencies comprising a low frequency at the frequency of the periodic train of pulses, a largest selected harmonic frequency and harmonic frequencies therebetween;
        estimate values for the impedance spectrum at one or more of the Fourier series frequencies when the impedance spectrum does not include a value at the one or more of the Fourier series frequencies;
        for each of the Fourier series frequencies, combine the Fourier series coefficients with either a measured value or an estimated value of the impedance spectrum at a corresponding frequency to obtain an estimated response at that corresponding frequency;
        assemble the estimated response at each of the Fourier series frequencies into an overall time response of the energy storage device; and
        subtract the overall time response from a bias voltage of the energy storage device to estimate the response of the energy storage device to the excitation pulse.

12. The system of claim 11, wherein the data acquisition device is further configured to obtain the impedance spectrum offline over a broad frequency range between a frequency that is less than or equal to the low frequency and a frequency that is greater than or equal to the largest selected harmonic frequency of the low frequency.

13. The system of claim 11, wherein the data acquisition device is further configured to obtain the impedance spectrum offline over a broad frequency range between a frequency that is less than or equal to the low frequency and a frequency that is greater than or equal to the largest selected harmonic frequency of the low frequency using techniques selected from the group consisting of a logarithmic frequency range, and a linearly spread frequency range.

14. The system of claim 11, wherein the data acquisition device is further configured to obtain the impedance spectrum online over a broad frequency range between a frequency that is less than or equal to the low frequency and a frequency that is greater than or equal to the largest selected harmonic frequency of the low frequency using techniques selected from the group consisting of Impedance Noise Identification, Compensated Synchronous Detection, and Fast Summation Transformation.

15. The system of claim 14, wherein the data acquisition device is further configured to obtain the impedance spectrum in-situ.

16. The system of claim 11, wherein the computing system is further configured to define the simulated pulse profile as at least one of a square wave, a triangle wave, and a sawtooth wave.

17. The system of claim 11, wherein the computing system is further configured to define the simulated pulse profile with a constant current, a constant voltage, or a constant power.

18. The system of claim 11, wherein the low frequency used in the Fourier series is greater than or equal to the lowest frequency of the impedance spectrum and wherein the largest selected harmonic frequency used in the Fourier series is less than or equal to the highest frequency of the impedance spectrum.

19. The system of claim 11, wherein the computing system is further configured to estimate values of the measured impedance spectrum at frequencies corresponding to the Fourier series coefficients through methods selected from the group consisting of linear interpolation and cubic spline fit.

20. The system of claim 11, wherein the computing system is further configured to smooth the estimated response with signal processing techniques to minimize or mitigate a Gibbs effect.

* * * * *